US011482284B1

(12) United States Patent
Pellizzer

(10) Patent No.: US 11,482,284 B1
(45) Date of Patent: Oct. 25, 2022

(54) PARALLEL DRIFT CANCELLATION

(71) Applicant: Micron Technology, Inc., Boise, ID (US)

(72) Inventor: Fabio Pellizzer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/238,056

(22) Filed: Apr. 22, 2021

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/0004* (2013.01); *G11C 13/0028* (2013.01); *G11C 13/0097* (2013.01); *G11C 2013/0078* (2013.01)

(58) Field of Classification Search
CPC ............ G11C 13/0069; G11C 13/0004; G11C 13/0028; G11C 13/003
USPC ........................................................ 365/148
See application file for complete search history.

(56) References Cited

U.S. PATENT DOCUMENTS

| | | | | |
|---|---|---|---|---|
| 2008/0151109 A1* | 6/2008 | Doswald | .............. | H04N 7/0147 348/E7.015 |
| 2008/0266942 A1* | 10/2008 | Jeong | .................. | G11C 13/004 365/163 |
| 2010/0142267 A1 | 6/2010 | Sarin | | |
| 2016/0049209 A1 | 2/2016 | Pandey et al. | | |
| 2019/0164600 A1 | 5/2019 | Castro | | |
| 2020/0321043 A1 | 10/2020 | Em | | |
| 2020/0372966 A1 | 11/2020 | Tortorelli et al. | | |

FOREIGN PATENT DOCUMENTS

KR 10-2020-0117374 A 10/2020

OTHER PUBLICATIONS

"International Search Report and Written Opinion of the International Searching Authority," issued in connection with Int'l Appl. No. PCT/US2022/071719 dated Aug. 4, 2022 (9 pages).

* cited by examiner

*Primary Examiner* — Vu A Le
(74) *Attorney, Agent, or Firm* — Holland & Hart LLP

(57) ABSTRACT

Methods, systems, and devices for parallel drift cancellation are described. In some instances, during a first duration, a first voltage may be applied to a word line to threshold one or more memory cells included in a first subset of memory cells. During a second duration, a second voltage may be applied to the word line to write a first logic state to one or more memory cells included in the first subset and to threshold one or more memory cells included in a second subset of memory cells. During a third duration, a third voltage may be applied to the word line to write a second logic state to one or more memory cells included in the second subset of memory cells.

25 Claims, 8 Drawing Sheets

US 11,482,284 B1

PARALLEL DRIFT CANCELLATION

FIELD OF TECHNOLOGY

The following relates generally to one or more systems for memory and more specifically to parallel drift cancellation.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
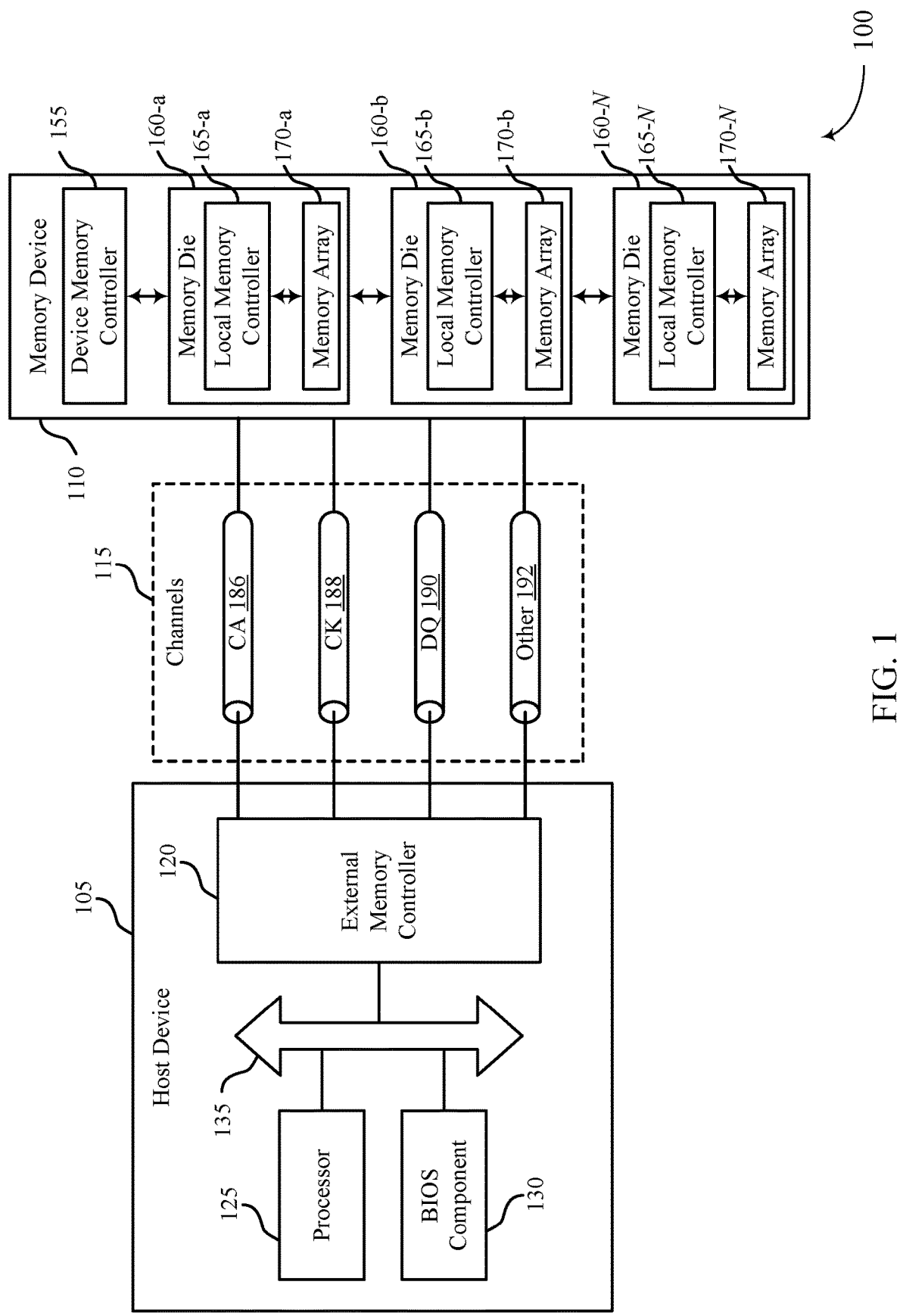
FIG. 1 illustrates an example of a system that supports parallel drift cancellation in accordance with examples as disclosed herein.

A memory device may include multiple memory arrays of memory cells (e.g., a partition including multiple memory tiles) and may perform access operations (e.g., write operations). That is, the memory device may apply a voltage (e.g., a write voltage) to the memory arrays via one or more access lines (e.g., a word line or a bit/digit line) to write a first logic state (e.g., a RESET state) or a second logic state (e.g., a SET state) to one or more memory cells. The memory device may write a logic state to each memory cell based on characteristics of the applied voltage. For example, the memory device may write a first logic state to a memory cell by applying a positive voltage across the memory cell and may write a second logic state to a memory cell by applying a negative voltage across the memory cell.

Applying a voltage across the memory cell may set a threshold voltage state of the memory cell, such that the logic state may be determined based on whether an applied voltage exceeds a threshold voltage of the memory cell causing current to run through the memory cell. In some cases, this phenomenon may be described as a snap-back event or thresholding the memory cell. If the applied voltage induces a current through the memory cell, the memory device may determine that the memory cell is storing the second logic state (e.g., a SET state). Additionally, if the applied voltage does not induce a current through the memory cell, the memory device may determine that the memory cell is storing a first logic state (e.g., a RESET state).

In some examples, the threshold voltage of one or more memory cells in the memory arrays may drift (e.g., increase or decrease) over time. For example, electrical characteristics of a memory cell (e.g., resistivity of the memory cell) may change after repeated access operations are performed on the memory cell resulting in a drift in threshold voltage. In some cases, a memory device may be configured to "cancel" drift that has occurred in any one memory cell. That is, the memory device may be configured to lower the threshold voltage of the memory cell having experienced drift. If a cell was previously programmed to a RESET state, it may have drifted over time. Accordingly, it may be difficult to program the memory cell to the SET state. However, performing a drift cancelation operation may cancel the drift that occurred so that programming a SET state to the memory cell will be successful. Additionally or alternatively, performing a drift cancelation operation may identify the logic states stored to certain memory cells. For example, if a cell does not snap when performing a drift cancelation operation then it may already be programmed to the desired state.

To cancel the drift of a memory cell (e.g., to lower its threshold voltage), the memory device may apply a voltage to the cell that corresponds to a logic state that was written to the cell during a prior access operation. For example, if a RESET state was written during a prior access operation (e.g., using a positive programming voltage), then a positive voltage may be applied to the cell to cancel or mitigate any drift that may have occurred.

In some instances, a logic state may be written to a memory cell after a drift cancelation operation. For example, a positive voltage may be applied to a memory cell to cancel drift that may have occurred and a negative voltage may then be applied to the memory cell during a write operation. The voltages applied to access lines may toggle multiple times between positive and negative for drift cancelation purposes and to perform access operations. In some instances, the word line may toggle between positive and negative three times during a drift cancelation operation and subsequent access operation to write a logic state to a memory cell, and may toggle between positive and negative six times when writing two different logic states. The toggling of the word line may consume time and power, which may be undesirable.

A memory device configured to perform drift cancelation and access operations concurrently is described herein. In some instances, drift cancelation may be performed on some memory cells (e.g., one or more memory cells of a first subset of memory cells) during a first portion of an access operation. The drift cancelation may be performed by driving a word line to a voltage (e.g., a first voltage) and selecting individual bit lines. The memory device may include circuitry configured to determine whether individual memory cells snap (e.g., threshold) based on driving the word line to the first voltage. After determining which memory cells snap, the word line may be driven to a second voltage which may result in a logic state (e.g., a first logic state) being written to the memory cell(s) that snaps. Moreover, while the word line is driven to the second voltage, drift cancelation may be concurrently performed on some memory cells (e.g., one or more memory cells of a second subset of memory cells). After determining which memory cells snap (e.g., threshold), the word line may be driven to a third voltage which may result in a logic state (e.g., a second logic state) being written to the memory cell(s) of the second subset that snaps. By performing drift cancelation and one or more access operations concurrently, the memory device described herein may save power and time associated with performing access operations.

Features of the disclosure are initially described in the context of memory systems, dies, and arrays as described with reference to FIGS. 1-3. Features of the disclosure are described in the context of a block diagram and a timing diagram as described with reference to FIGS. 4 and 5. These and other features of the disclosure are further illustrated by and described with reference to an apparatus diagram and flowcharts that relate to parallel drift cancellation as described with references to FIGS. 6-8.

FIG. 1 illustrates an example of a system 100 that supports parallel drift cancellation in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, one or more memory cells of the memory device 110 may experience drift. For example, a memory array 170 may include one or more memory cells (e.g., coupled with a word line) that was written to a second logic state (e.g., a RESET state) during a prior access operation. Accordingly, after the access operation was performed the threshold voltage of the memory cells storing the second logic state may drift (e.g., to an undesirably high threshold voltage). To cancel (e.g., mitigate) the drift, the local memory controller 165 may apply a first voltage to the word line. In some instances, the first voltage may be associated with the voltage used to program the prior logic state. Accordingly, for exemplary purposes only, the first voltage may be a positive voltage corresponding to the RESET state.

While the first voltage is applied to the word line, individual digit lines may be selected (e.g., selected sequentially or concurrently). Memory cells storing the RESET state may snap (e.g., threshold), whereas memory cells storing the SET state may not threshold. After determining which memory cells threshold, a second voltage may be applied to the word line. For exemplary purposes only, the second voltage may be a negative voltage and may result in a SET state being written to the memory cells that snapped (e.g., thresholded). Moreover, drift cancelation may occur on the memory cells storing the SET state based on the second voltage being applied to the word line. Accordingly, when a second voltage is applied to the word line, some memory cells may undergo an access operation while some memory cells may undergo drift cancellation.

After the second voltage is applied to the word line, a third voltage may be applied to the word line. In some instances, the third voltage may be a same voltage as the first voltage (e.g., a positive voltage). Applying the third voltage to the word line may result in the memory cells that snapped (e.g., thresholded) while the second voltage was applied to the word line being written to the RESET state. Thus, the methods described herein may result in a word line being moved a relatively low quantity of times to cancel drift and perform access operations on a memory array. Such methods may save power and time that would otherwise be incurred when performing the same operations.

Figure 2:
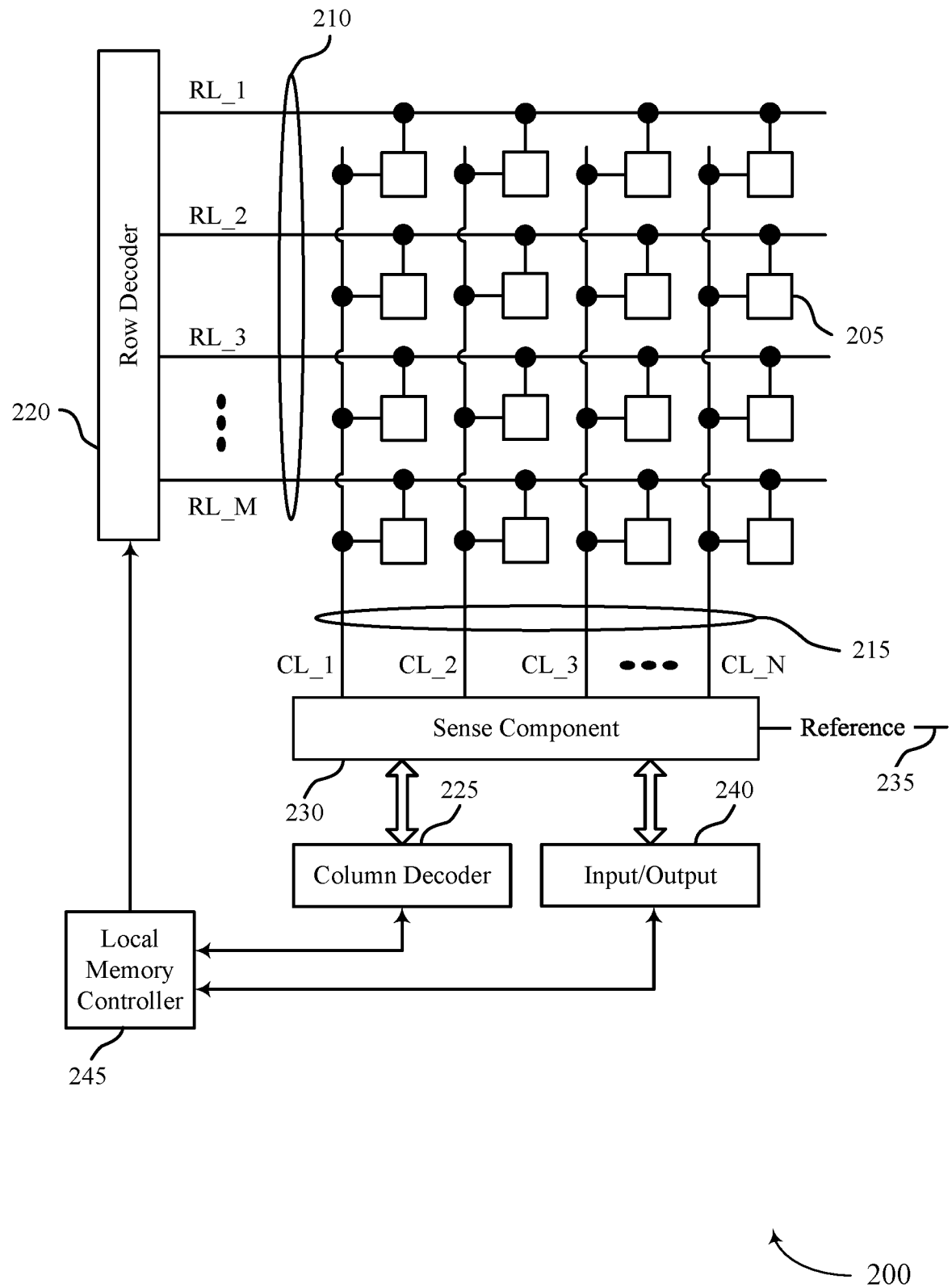
FIG. 2 illustrates an example of a memory die that supports parallel drift cancellation in accordance with examples as disclosed herein.

FIG. 2 illustrates an example of a memory die 200 that supports parallel drift cancellation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell. A configurable material may also refer to other types of memory elements such as resistive memories, bipolar resistive memories, magnetoresistive memories, and the like.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200.

During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

In some examples, the memory die 200 may include one or more tiles, which may refer to the smallest addressable portion of a memory array. For example, a tile may include or be associated with a 1k×1k or a 2k×2k portion of the memory die 200. Moreover, the local memory controller 245 may be configured to perform access operations and drift cancelation operations on one or more memory cells 205. Each tile may include independent access lines for the memory cells 205 in the tile. Each tile may include independent sense amplifiers, in some cases.

In some instances, an access operation (e.g., a write operation) may be performed on a single memory cell 205 in a tile at a time. For example, if a particular access operation is performed on sixty-four (64) memory cells 205, the access operation may be performed on one memory cell 205 in each of sixty-four tiles. Additionally or alternatively, parallel access operations may be performed on the memory die 200. For example, in a parallel access operation, more than one bit may be read from or written to within a single tile for an access operation. For example, for an access operation performed on sixty-four (64) memory cells 205, the access operation may be performed on eight (8) memory cells 205 in each of eight (8) tiles.

As described herein, one or more memory cells 205 of the memory die 200 may experience drift. For example, a row line 210 (e.g., RL_1) may include one or more memory cells 205 that was written to a second logic state (e.g., a RESET state) during a prior access operation. Accordingly, after the access operation was performed the threshold voltage of the memory cells 205 storing the second logic state may drift (e.g., to an undesirably high threshold voltage), which may result in it being difficult to program a first logic state (e.g., a SET state) to the memory cell 205. To cancel (e.g., mitigate) the drift, the local memory controller 245 may apply a first voltage to the row line 210 (e.g., to RL_1). In some instances, the first voltage may be associated with the voltage used to program the prior logic state. Accordingly, for exemplary purposes only, the first voltage may be a positive voltage corresponding to the RESET state.

While the first voltage is applied to the row line 210 (e.g., to RL_1), individual column lines 215 may be selected (e.g., selected sequentially or concurrently). Memory cells 205 storing the RESET state may snap (e.g., threshold), whereas memory cells 205 storing the SET state may not threshold. In some examples, if a memory cell 205 does not snap then it may not be subsequently written as described herein. That is, if the memory cell 205 does not snap, then the memory cell 205 may be programmed to the SET state and a subsequent write operation may be unnecessary (e.g., the memory cell 205 may not need to be written to the SET state). Performing (or not performing) an access operation on a memory cell 205 based on whether it snaps may be referred to herein as a "normal write." Additionally or alternatively, if a memory cell 205 does not snap it may be written during a subsequent access operation regardless. That is, if the memory cell 205 does not snap then its state may be written (e.g., re-written) during a subsequent access operation even if a same logic state is being written to the memory cell 205. Performing an access operation on a memory cell 205 regardless of whether it snaps may be referred to herein as a "force write."

During a normal write operation, after determining which memory cells 205 threshold, a second voltage may be applied to the row line 210. For exemplary purposes only, the second voltage may be a negative voltage and may result in a SET state being written to the memory cells 205 that snapped (e.g., thresholded). Moreover, drift cancelation may occur on the memory cells 205 storing the SET state based on the second voltage being applied to the row line 210. Accordingly, when a second voltage is applied to the row line 210, some memory cells 205 may undergo an access operation while some memory cells 205 may undergo drift cancellation.

After the second voltage is applied to the row line 210, a third voltage may be applied to the row line 210. In some instances, the third voltage may be a same voltage as the first voltage (e.g., a positive voltage). Applying the third voltage to the row line 210 may result in the memory cells 205 that snapped (e.g., thresholded) while the second voltage was applied to the row line 210 being written to the RESET state. Thus, the row line 210 may be moved (e.g., a voltage of the row line 210 may be changed) a relatively low quantity of times to cancel drift and perform access operations on a tile of the memory die 200.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration. The methods described herein may result in a row line 210 being moved a relatively low quantity of times to cancel drift and perform access operations on a tile of the memory die 200. Such methods may save power and time that would otherwise be incurred when performing the same operations.

Figure 3:
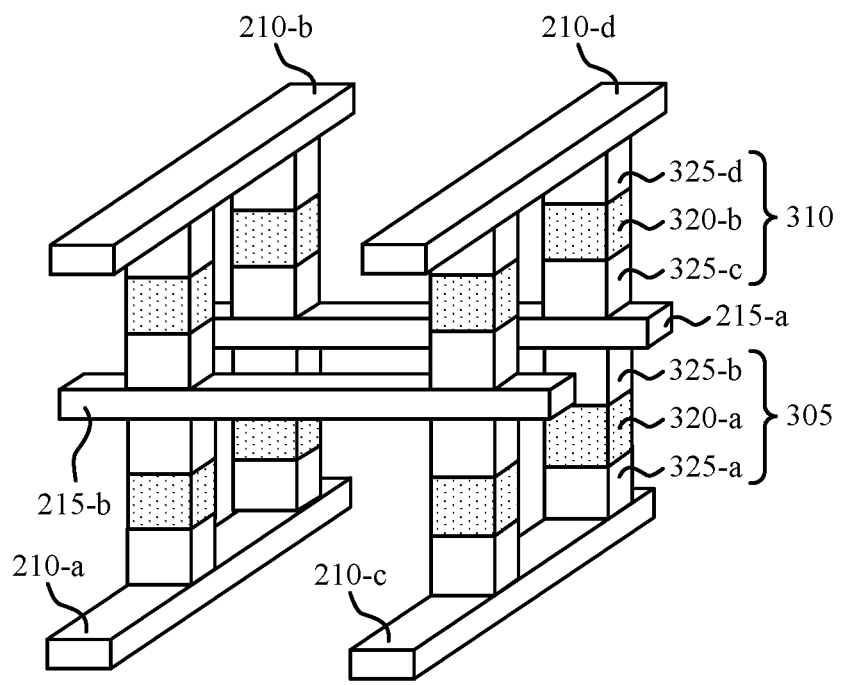
FIG. 3 illustrates an example of memory cells that support parallel drift cancellation in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-a, storage element 320-a, electrode 325-b), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some examples, one or more memory cells of the memory array 300 may experience drift. For example, the memory array 300 may include one or more memory cells (e.g., coupled with a row line 210) that was written to a second logic state (e.g., a RESET state) during a prior access operation. Accordingly, after the access operation was performed the threshold voltage of the memory cells storing the second logic state may drift (e.g., to an undesirably high threshold voltage). To cancel (e.g., mitigate) the drift, the local memory controller (e.g., a local memory controller 165 or a local memory controller 245 as described with reference to FIGS. 1 and 2, respectively) may apply a first voltage to a row line 210. In some instances, the first voltage may be associated with the voltage used to program the prior logic state. Accordingly, for exemplary purposes only, the first voltage may be a positive voltage corresponding to the RESET state.

While the first voltage is applied to the row line 210, individual column lines 215 may be selected (e.g., selected sequentially or concurrently). Memory cells storing the RESET state may snap (e.g., threshold), whereas memory cells storing the SET state may not threshold. After determining which memory cells threshold, a second voltage may be applied to the row line 210. For exemplary purposes only, the second voltage may be a negative voltage and may result in a SET state being written to the memory cells that snapped (e.g., thresholded). Moreover, drift cancelation may occur on the memory cells storing the SET state based on the second voltage being applied to the row line 210. Accordingly, when a second voltage is applied to the row line 210, some memory cells may undergo an access operation while some memory cells may undergo drift cancellation.

After the second voltage is applied to the row line 210, a third voltage may be applied to the row line 210. In some instances, the third voltage may be a same voltage as the first voltage (e.g., a positive voltage). Applying the third voltage to the row line 210 may result in the memory cells that snapped (e.g., thresholded) while the second voltage was applied to the row line 210 being written to the RESET state. Thus, the methods described herein may result in a row line 210 being moved a relatively low quantity of times to cancel drift and perform access operations on a memory array. Such methods may save power and time that would otherwise be incurred when performing the same operations.

Figure 4:
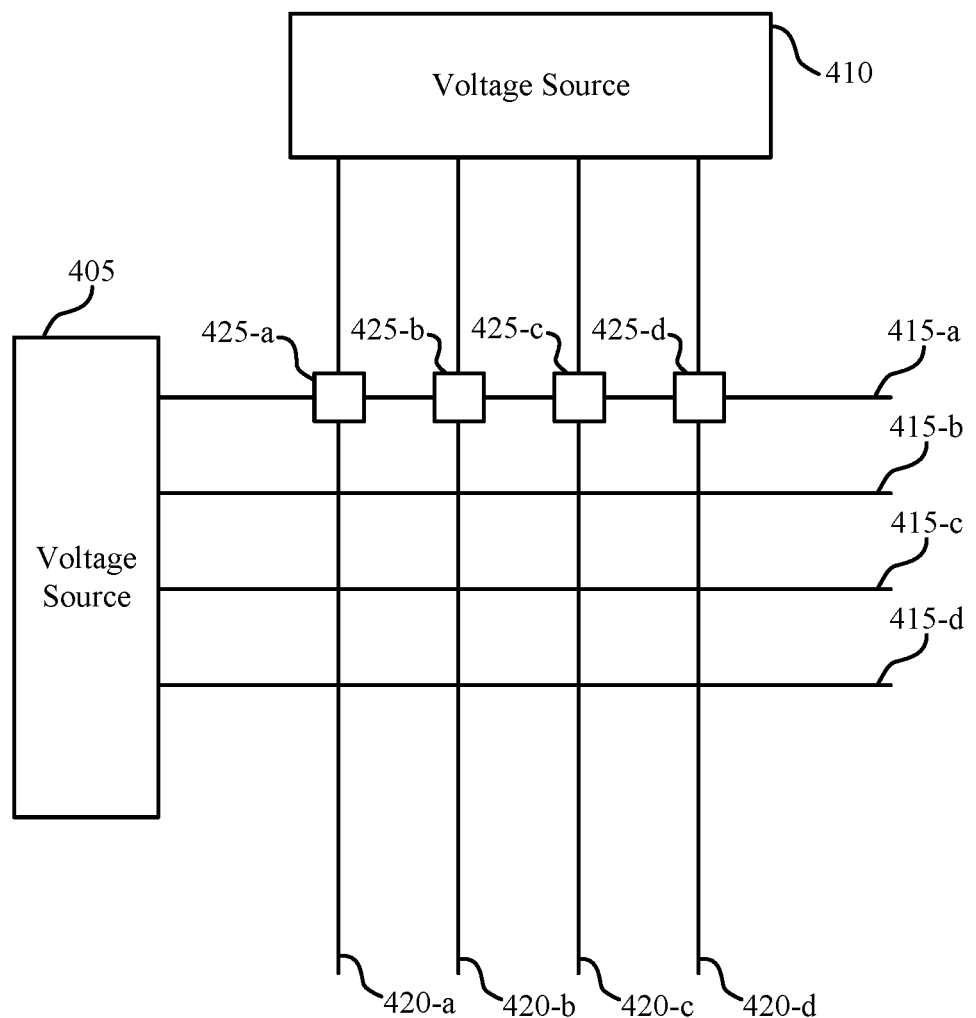
FIG. 4 illustrates an example of a block diagram that supports parallel drift cancellation in accordance with examples as disclosed herein.

FIG. 4 illustrates an example of a block diagram 400 that supports parallel drift cancellation in accordance with examples as disclosed herein. In some examples, the block diagram 400 may depict aspects of a memory array, and may include a voltage source 405 and a voltage source 410. The voltage source 405 may be coupled with one or more word lines 415 and the voltage source 410 may be coupled with one or more bit lines 420. A memory cell 425 may be located at the intersection of each word line 415 and each bit line 420. In some instances, the word lines 415 may be moved a relatively low quantity of times to cancel drift and perform access operations for the memory cells 425. Such methods may save power and time that would otherwise be incurred when performing the same operations.

In some examples, the voltage source 405 may be configured to apply a first voltage, a second voltage, and a third voltage to the word lines 415. The voltage source 405 may be coupled with a controller, such as a local memory controller 245 as described with reference to FIG. 2, that is configured to initiate application of the different voltages to the word lines 415. Whether the first voltage, the second voltage, or the third voltage is applied to a word line 415 may depend on which portion of an access operation being performed.

For example, when programming a RESET state to a memory cell 425 that was previously programmed to a SET state, the first voltage may be applied to a word line 415 during a first portion of the access operation and the second voltage may be applied to the word line 415 during a second portion of the access operation. As described herein, the second portion of an access operation may include both drift cancelation operations and write operations. Thus, a SET state may be programmed to some memory cells during the second portion of the access operation (e.g., while the second voltage is applied to the word line 415), and the third voltage may be applied to the word line 415 during a third portion of the access operation. In some instances, the first voltage and the third voltages may be associated with a first polarity and a third polarity, respectively, and the second voltage may be associated with a second polarity. The first polarity and the third polarity may be a different polarity than the second polarity. Moreover, although the ordering described herein may indicate that a SET-to-RESET occurs before a RESET-to-SET operation, the ordering of the drift cancelation operations and access operations is interchangeable. In addition, the definitions of polarity for a memory cell may depend on the deck of the memory cells. For example, positive polarity across a memory cell may be determined with reference to access lines that are located on the top of the deck of memory cells. That is, a memory cell may be determined to have a positive polarity voltage applied when the access line above the memory cell is at a higher potential than the access line located below the memory cell. In the example given in FIGS. 4, 5A, and 5B, it is understood that the word lines 415 are at the top of the memory cells 425 and the digit lines 420 are at the bottom of the memory cells 425. Thus, a positive polarity from a word line 415 to a digit line 420 is understood to program a RESET or logic '0' state to a memory cell 425, while a negative polarity is understood to program a SET or logic '1' state to the memory cell 425. However, it should be understood that these definitions of polarity may be reversed, and that the polarities associated with SET or RESET states may also be reversed.

Additionally or alternatively, the voltage source 410 may be configured to apply a fourth voltage, a fifth voltage, and a sixth voltage, and a seventh voltage to the digit lines 420. The voltage source 410 may be coupled with a controller, such as a local memory controller 245 as described with reference to FIG. 2, that is configured to initiate application of the different voltages to the digit lines 420. Whether the fourth voltage, the fifth voltage, the sixth voltage, or the seventh voltage is applied to a digit line 415 may depend on which portion of an access operation is being performed and on incoming data to be programmed to the memory cells 425.

For exemplary purposes only, the timing diagrams 500-*a* and 500-*b* described with reference to FIGS. 5A and 5B may illustrate aspects of an access operation where some memory cells are written to a RESET state and some memory cells are written to a SET state. For example, the memory cell 425-*a* may be programmed to a SET state and may undergo a drift cancelation operation and a write operation to program a RESET state to the memory cell 425-*a*. Additionally or alternatively, the memory cell 425-*d* may be programmed to a RESET state and may undergo a drift cancelation operation and a write operation to program a SET state to the memory cell 425-*d*.

In some instances, the memory cell 425-*b* may be programmed to a RESET state and may undergo a drift cancelation operation but may remain in a RESET state (e.g., a write operation may not be performed on the memory cell 425-*b*). Moreover, the memory cell 425-*c* may be programmed to a SET state and may undergo a drift cancellation operation but may remain in the SET state (e.g., a write operation may not be performed on the memory cell 425-*c*.

Figure 5A:
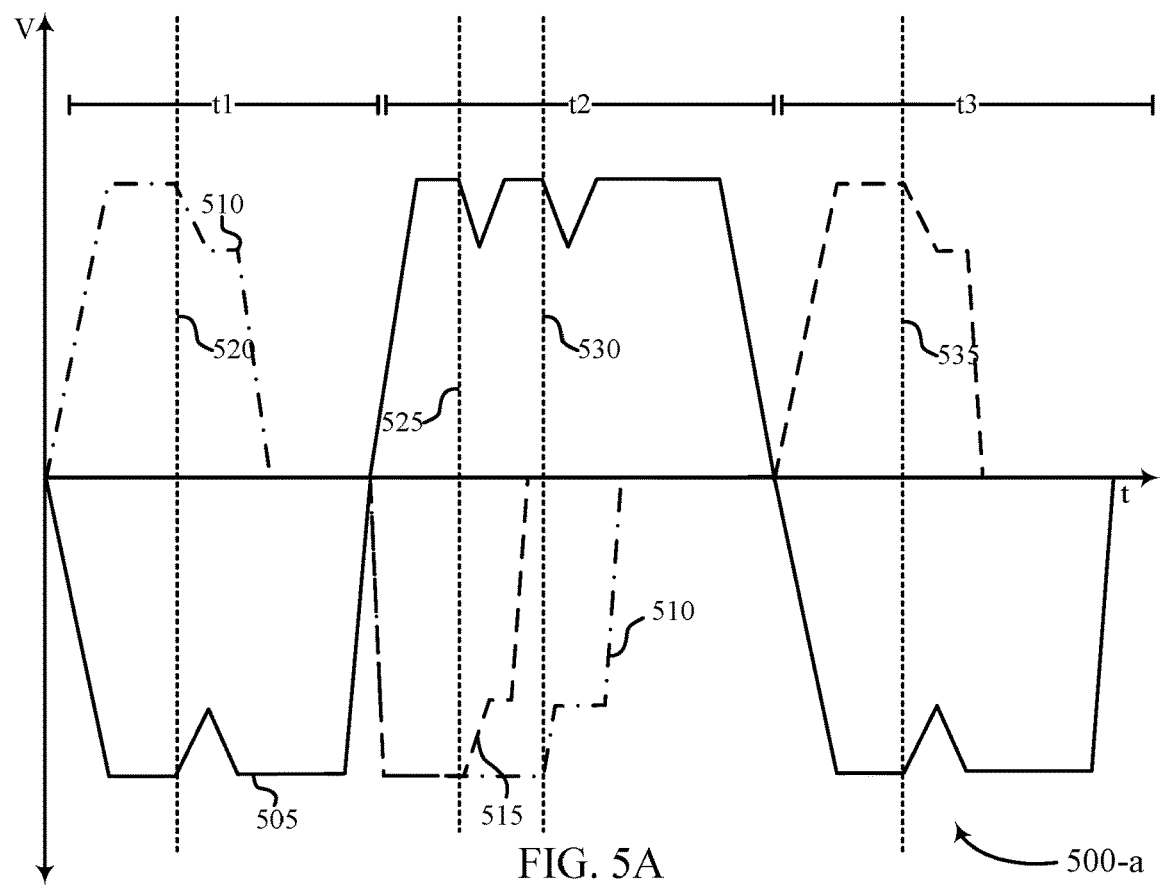
FIGS. 5A and 5B illustrate examples of timing diagrams that support parallel drift cancellation in accordance with examples as disclosed herein.
Figure 5B:
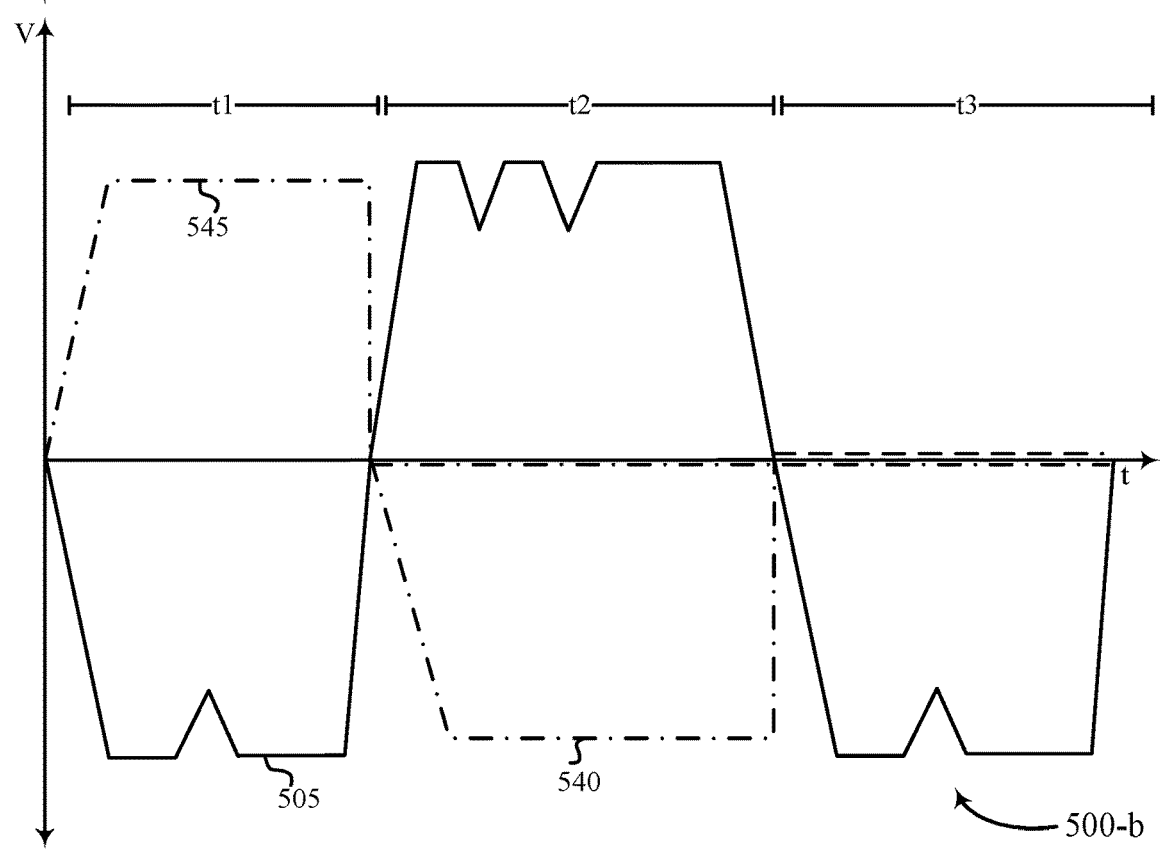

FIGS. 5A and 5B illustrate timing diagrams 500-*a* and 500-*b*, respectively, that support parallel drift cancellation in accordance with examples as disclosed herein. In some examples, the timing diagrams illustrate aspects of drift cancelation operations and access operations performed on the memory cells 425 as described with reference to FIG. 4. For example, the signal 505 may represent a voltage of the word line 415-*a*, the signal 510 may represent a voltage of the digit line 420-*a*, and the signal 515 may represent a voltage of the digit line 420-*d*. The signal 540 may represent a voltage of the digit line 420-*c* and the signal 545 may represent a voltage of the digit line 420-*b*. The drift cancelation and access operations associated with the timing diagrams 500-*a* and 500-*b* may save an associated memory device power and time that would otherwise be incurred when performing the same operations.

As illustrated in FIG. 5A, during t1 the word line 415-*a* may be driven to a first voltage, which may be represented by the signal 505 going low. For example, the first voltage may be a negative voltage and may be applied to the word line 415-*a* by the voltage source 405. In some instances, one or more of the digit lines 420 may be selected, which may cause one or more of the memory cells 425 to snap (e.g., to threshold). For example, the digit lines 420 may be selected concurrently or sequentially to determine which of the memory cells 425 snap. In some examples, the digit lines 420 may be selected based on incoming data. For example, if incoming data corresponds to a RESET state then the digit line 420-*a* and the digit line 420-*c* may go high during t1. In some instances, a driver associated with the word line 415-*a* may be active during the entirety of t1, but may have a finite or relatively high output impedance to limit instantaneous current. Accordingly, when a memory cell 425 snaps, the word line 415 may collapse and subsequently recharge based on the driver. In some examples, the driver may be a current-limited driver.

Based on the voltage differential between the digit line 420 and the word line 415, some memory cells 425 having been previously written to a SET state may snap (e.g., threshold). As described above, the memory cell 425-*a* may have been programmed to a SET state and may be written to a RESET state (e.g., during t2) and thus may snap during t1. Accordingly, the signal 510 may represent the voltage of the digit line 420-*a*.

Additionally or alternatively, as described with reference to FIG. 5B, Since the memory cell 425-*c* is not being written to a RESET state during t2 (e.g., and is being maintained in the SET state), the digit line 420-*c* may be driven to an intermediate voltage during t1 and thus may not snap (e.g., as indicated by the signal 540). The intermediate voltage may not produce a voltage differential that would make the memory cell 425-*c* snap. In some instances, the digit line 420-*c* may be driven to ground during t1, or may be driven to ground during t2 or t3, as shown in FIG. 5B. During a normal write operation the digit line 420-*c* may be driven to ground (e.g., 0V) during t2 since the logic state of the memory cell 425-*c* is not being changed. However, during a forced write operation, the digit line 420-*c* may be driven to a voltage (e.g., a write voltage, a fourth voltage) during t2.

In some examples, as shown in FIG. 5A, the voltage of the digit line 420-*a* may go high (e.g., relative to the word line 415-*a*) during t1. In some instances, the digit line 420-*a* may be driven high (e.g., by the voltage source 410) such that a voltage of the word line 415-*a* is lower than a voltage of the digit line 420-*a*. The memory cell 425-*a* may experience a snap 520, due to an increase in current across the memory cell 425-*a*, that is represented by a decrease in a voltage of the digit line 420-*a* (e.g., a decrease in the signal 510) and an increase in a voltage of the word line 415-*a* (e.g., an increase in the signal 505). That is, the voltage between the digit line 420-*a* and word line 415-*a* may decrease when the snap 520 occurs, due to the increase in current across the memory cell 425-*a* and impedance of the drivers of the digit line 420-*a* and word line 415-*a*. The snap 520 may be detected by the drive of the digit line 420-*a* (voltage source 410), which may then decrease the digit line 420-*a* (e.g., to a voltage that reduces the potential across the memory cell such as ground).

During t2, the word line 415-*a* may be driven to a second voltage, which may be represented by the signal 505 going high. For example, the second voltage may be a positive voltage and may be applied to the word line 415-*a* by the voltage source 405. In some instances, some of the digit lines 420 may be selected (or may remain selected), which may cause one or more of the memory cells 425 to snap (e.g., to threshold). In some instances, each of the digit lines 420 may be selected during t2, while in other examples the digit line 420-c may not be selected or driven to ground since the memory cell 425-c is not being written. As described herein, the digit lines 420 may be selected concurrently or sequentially.

In some instances, driving the word line 415-a to the second voltage may cause some memory cells 425 to snap. For example, due to the voltage differential between the word line 415-a and some digit lines 420, memory cells 425 having been previously written to a RESET state may snap (e.g., threshold). As described above, the memory cell 425-b and the memory cell 425-d may have been programmed to a RESET state, but only the memory cell 425-d may be written to a SET state (e.g., during t3). Accordingly, the signal 515 may represent the voltage of the digit line 420-d.

During t2, the voltage of the digit line 420-d may go low (e.g., relative to the word line 415-a). In some instances, the digit line 420-d may be driven low (e.g., by the voltage source 410) such that a voltage of the word line 415-a is higher than a voltage of the digit line 420-a. The memory cell 425-d may experience a snap 525 that is represented by an increase in a voltage of the digit line 420-d (e.g., an increase in the signal 515) and a decrease in a voltage of the word line 415-a (e.g., a decrease in the signal 505). That is, the voltage between the digit line 420-d and word line 415-a may decrease when the snap 525 occurs, due to the increase in current across the memory cell 425-d and impedance of the drivers of the digit line 420-d and word line 415-a. The snap 525 may be detected by the drive of the digit line 420-d (voltage source 410), which may then increase the digit line 420-d (e.g., to a voltage that reduces the potential across the memory cell such as ground).

Additionally or alternatively, as described with reference to FIG. 5B, Since the memory cell 425-c is not being written to a SET state during t2 (e.g., and is being maintained in the RESET state), the digit line 420-c may be driven to an intermediate voltage during t2 and thus may not snap (e.g., as indicated by the signal 545). The intermediate voltage may not produce a voltage differential that would make the memory cell 425-c snap. In some instances, the digit line 420-c may be driven to ground during t2 and t3, as shown in FIG. 5B. During a normal write operation the digit line 420-c may be driven to ground (e.g., 0V) during t2 since the logic state of the memory cell 425-c is not being changed. However, during a forced write operation, the digit line 420-c may be driven to a voltage (e.g., a write voltage, a fourth voltage) during t2.

After the snap 525, the word line 415-a may return to the second voltage. For example, the word line 415-a may return to the second voltage because it may be driven to the second voltage (e.g., by the voltage source 405) during the entirety of t2. When the word line 415-a returns to the second voltage, a RESET state may be written to the memory cell 425-a. In some instances, the snap 525 may occur before the RESET state is written to the memory cell (e.g., the drift cancellation of the RESET state for cell 425-d may occur prior to the write of memory cell 425-a to the RESET state). That is, the snap 525 may temporarily pull down the word line 415-a, which may delay the write operation. When the write voltage is applied to the digit line 420-a, a RESET state may be written to the memory cell 425-a, and a voltage of the word line 415-a may temporarily decrease (e.g., represented by 530). That is, the signal 505 may decrease and the signal 510 may temporarily increase based on writing the RESET state to the memory cell 425-a. That is, the voltage between the digit line 420-a and word line 415-a may decrease when the write 530 occurs, due to the increase in current across the memory cell 425-a and impedance of the drivers of the digit line 420-a and word line 415-a. The write 530 may be detected by the driver of the digit line 420-a (voltage source 410), which may then increase the digit line 420-a (e.g., to a voltage that reduces the potential across the memory cell such as ground).

Although FIG. 5A illustrates the snap 525 occurring before the RESET state is written to the memory cell 425-a, the RESET state may be written to the memory cell 425-a before the snap 525 in some instances. That is, the write 530 of memory cell 425-a may occur prior to the snap 525 of memory cell 425-d. As described above, the two operations may occur sequentially due to the word line 415-a being temporarily pulled down. After the temporary decrease in the voltage of the word line 415-a, the word line 415-a may return to the second voltage because it may be driven to the second voltage (e.g., by the voltage source 405) during the entirety of t2.

As described above, during t2 some memory cells 425 may undergo drift cancelation, while other memory cells are written. That is, during t2 drift cancelation and write operations may occur concurrently (e.g., the voltage to perform drift cancellation and write operations may be applied concurrently, with write operations and snapping occurring sequentially because of the temporary collapse of the word line voltage when they occur). In some instances, and as illustrated in FIGS. 5A and 5B, drift cancelation may occur before a write operation based on driving the word line 415-a to the second voltage (e.g., the drift cancelation operation and the write operation may occur sequentially). Moreover, although a write operation and a drift cancelation operation are illustrated as being performed on one memory cell each, the operations may be performed on any quantity of memory cells. For example, the operations may be performed on each memory cell addressed by a word line in a tile.

During t3, the word line 415-a may be driven to a third voltage, which may be represented by the signal 505 going low. For example, the third voltage may be a negative voltage, and may be a same (or different) voltage as the first voltage. When the word line 415-a is driven to the third voltage, a write voltage (e.g., a fourth voltage) may be applied to the digit line 420-d to write a SET state to the memory cell 425-d. When the write voltage is applied to the digit line 420-d, a SET state may be written to the memory cell 425-d. When the memory cell 425-d snaps as a result of the write voltage, a voltage of the word line 415-a may temporarily increase (e.g., represented by 535). That is, the signal 505 may increase and the signal 515 may temporarily decrease based on writing the SET state to the memory cell 425-d. The voltage between the digit line 420-d and word line 415-a may decrease when the write 535 occurs, due to the increase in current across the memory cell 425-d and impedance of the drivers of the digit line 420-d and word line 415-a. The write 535 may be detected by the driver of the digit line 420-d (voltage source 410), which may then decrease the digit line 420-d (e.g., to a voltage that reduces the potential across the memory cell such as ground). After the temporary increase in the voltage of the word line 415-a, the word line 415-a may return to the third voltage because it may be driven to the third voltage (e.g., by the voltage source 405) during the entirety of t3 (e.g., for programming any additional cells to the SET state).

Accordingly, as illustrated by FIGS. 5A and 5B, the word line 415-*a* may be moved a relatively low quantity of times to cancel drift and perform access operations on a memory array. Moving the word line 415-*a* a relatively low quantity of times may save power and time that would otherwise be incurred when performing the same operations.

Figure 6:
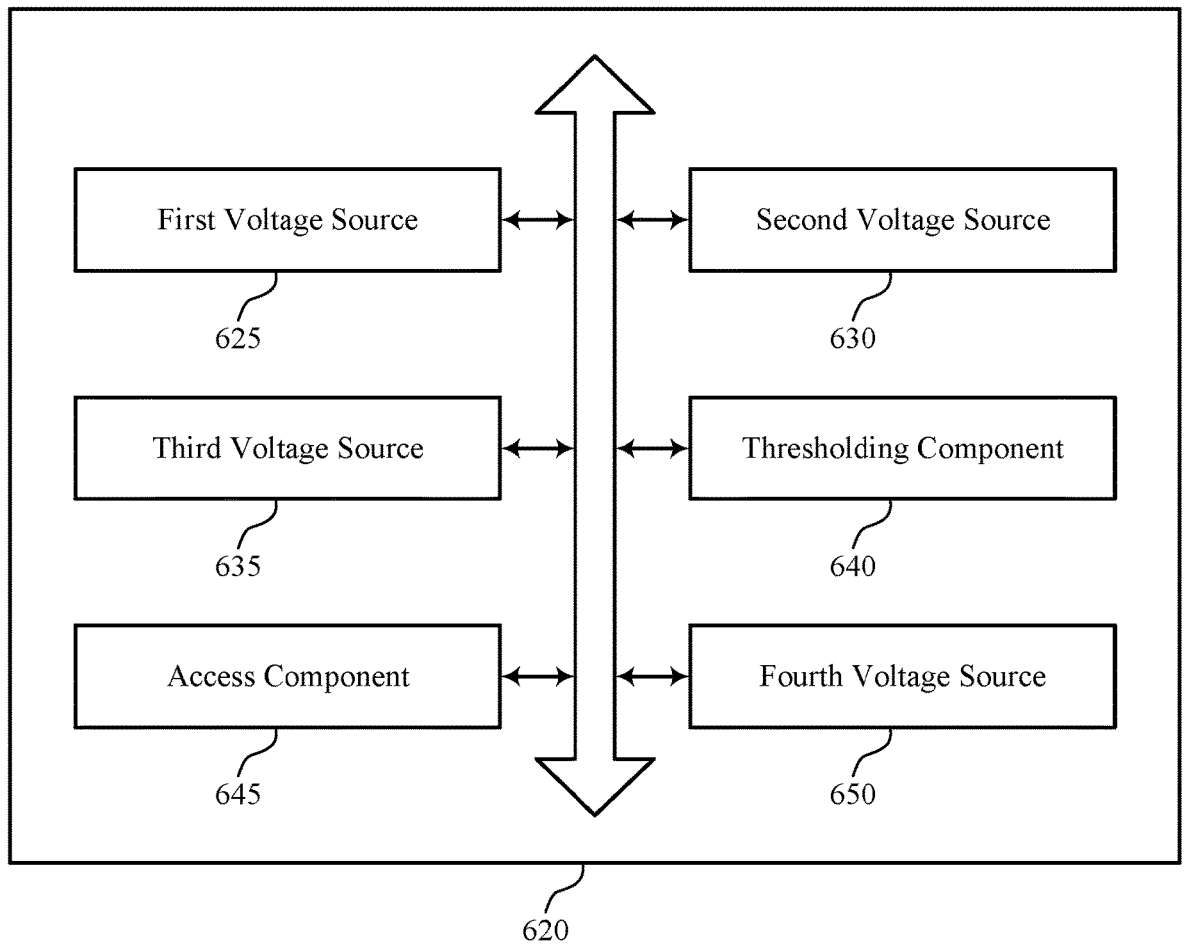
FIG. 6 shows a block diagram of a memory device that supports parallel drift cancellation in accordance with examples as disclosed herein.

FIG. 6 shows a block diagram 600 of a memory device 620 that supports parallel drift cancellation in accordance with examples as disclosed herein. The memory device 620 may be an example of aspects of a memory device as described with reference to FIGS. 1 through 5. The memory device 620, or various components thereof, may be an example of means for performing various aspects of parallel drift cancellation as described herein. For example, the memory device 620 may include a first voltage source 625, a second voltage source 630, a third voltage source 635, a thresholding component 640, an access component 645, a fourth voltage source 650, or any combination thereof. Each of these components may communicate, directly or indirectly, with one another (e.g., via one or more buses).

The first voltage source 625 may be configured as or otherwise support a means for applying, during a first duration, a first voltage to a word line coupled with a set of memory cells, where, during the first duration, at least one memory cell of a first subset of the set of memory cells thresholds based at least in part on applying the first voltage to the word line.

The second voltage source 630 may be configured as or otherwise support a means for applying, during a second duration after the first duration, a second voltage to the word line, where, during the second duration, at least one memory cell of a second subset of the set of memory cells thresholds and at least one memory cell of the first subset of the set of memory cells is written to a first logic state based at least in part on applying the second voltage to the word line. In some examples, the second voltage source 630 may be configured as or otherwise support a means for applying, during a second portion of the second duration, the second voltage to the word line for a second time, where, during the second portion of the second duration, at least one additional memory cell of the second subset of the set of memory cells thresholds based at least in part on applying the second voltage to the word line for a second time.

The third voltage source 635 may be configured as or otherwise support a means for applying, during a third duration after the second duration, a third voltage to the word line, where, during the third duration, at least one memory cell of the second subset of the set of memory cells is written to a second logic state based at least in part on applying the third voltage to the word line.

The thresholding component 640 may be configured as or otherwise support a means for thresholding, during a first portion of an access operation, a first subset of a set of memory cells, where each memory cell of the set of memory cells is coupled with a same word line. In some examples, the thresholding component 640 may be configured as or otherwise support a means for thresholding, during the second portion of the access operation and concurrent with writing the first logic state to the at least one memory cell of the first subset of the set of memory cells, at least one memory cell of a second subset of the set of memory cells.

In some examples, to support thresholding the first subset of the set of memory cells, the thresholding component 640 may be configured as or otherwise support a means for applying a first programming pulse to the set of memory cells during the first portion of the access operation, where the first programming pulse includes a first polarity. In some examples, to support writing the first logic state to the at least one memory cell of the first subset of the set of memory cells and thresholding the at least one memory cell of the second subset of the set of memory cells, the thresholding component 640 may be configured as or otherwise support a means for applying a second programming pulse to the set of memory cells during the second portion of the access operation, where the second programming pulse includes a second polarity that is different than the first polarity.

The access component 645 may be configured as or otherwise support a means for writing, during a second portion of the access operation, a first logic state to at least one memory cell of the first subset of the set of memory cells based at least in part on thresholding the first subset of the set of memory cells. In some examples, the access component 645 may be configured as or otherwise support a means for writing, during a third portion of the access operation, a second logic state to the memory cells of the second subset of the set of memory cells based at least in part on thresholding the at least one memory cell of the second subset of the set of memory cells.

In some examples, the fourth voltage source 650 may be configured as or otherwise support a means for applying, during the second duration after the first duration, a fourth voltage to a digit line associated with the at least one memory cell of the first subset of the set of memory cells based at least in part on applying the second voltage to the word line, where the at least one memory cell of the first subset of the set of memory cells is written to the first logic state based at least in part on applying the fourth voltage to the digit line.

In some examples, the second voltage is applied to the word line for the entirety of the second duration. In some examples, during the first duration, the at least one memory cell of a first subset of the set of memory cells thresholds based at least in part on a prior logic state written to the at least one memory cell of the first subset of the set of memory cells. In some examples, during the second duration, the at least one memory cell of a second subset of the set of memory cells thresholds before the at least one memory cell of the first subset of the set of memory cells is written to a first logic state based at least in part on applying the second voltage to the word line.

In some examples, the first voltage and the third voltage include a same voltage. In some examples, the first subset of the set of memory cells thresholds based at least in part on applying the first programming pulse and based at least in part on a logic state written to the first subset of the set of memory cells during a prior access operation. In some examples, at least a portion of writing the first logic state to the at least one memory cell of the first subset of the set of memory cells and thresholding the at least one memory cell of the second subset of the set of memory cells occurs concurrently. In some examples, the at least one memory cell of the second subset of the set of memory cells is thresholded before the first logic state is written to the at least one memory cell of the first subset of the set of memory cells.

Figure 7:
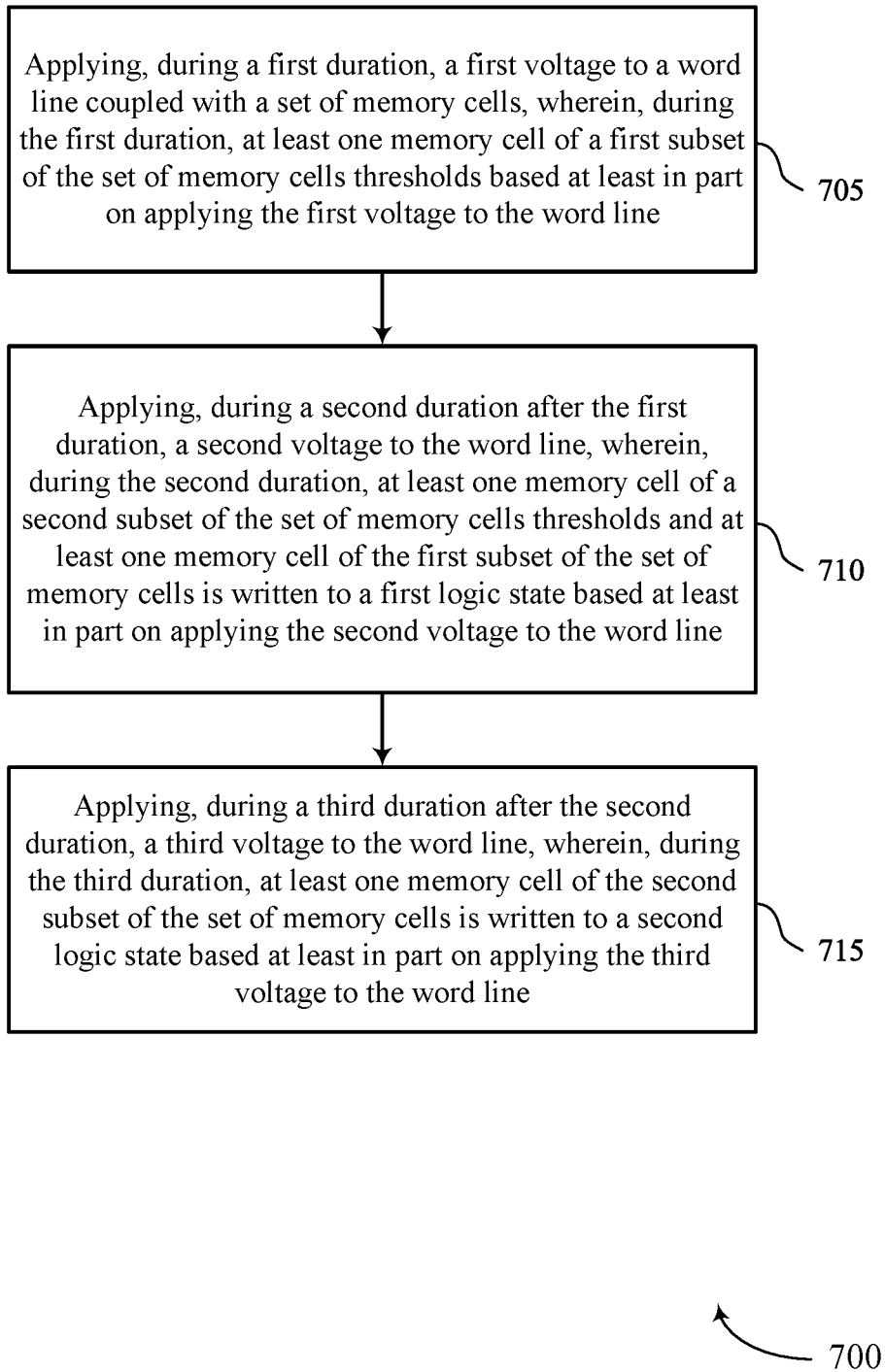
FIGS. 7 and 8 show flowcharts illustrating a method or methods that support parallel drift cancellation in accordance with examples as disclosed herein.

FIG. 7 shows a flowchart illustrating a method 700 that supports parallel drift cancellation in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include applying, during a first duration, a first voltage to a word line coupled with a set of memory cells, where, during the first duration, at least one memory cell of a first subset of the set of memory cells thresholds based at least in part on applying the first voltage to the word line. The operations of 705 may be performed in accordance with examples as disclosed herein. In some examples, aspects of the operations of 705 may be performed by a first voltage source 625 as described with reference to FIG. 6.

At 710, the method may include applying, during a second duration after the first duration, a second voltage to the word line, where, during the second duration, at least one memory cell of a second subset of the set of memory cells thresholds and at least one memory cell of the first subset of the set of memory cells is written to a first logic state based at least in part on applying the second voltage to the word line. The operations of 710 may be performed in accordance with examples as disclosed herein. In some examples, aspects of the operations of 710 may be performed by a second voltage source 630 as described with reference to FIG. 6.

At 715, the method may include applying, during a third duration after the second duration, a third voltage to the word line, where, during the third duration, at least one memory cell of the second subset of the set of memory cells is written to a second logic state based at least in part on applying the third voltage to the word line. The operations of 715 may be performed in accordance with examples as disclosed herein. In some examples, aspects of the operations of 715 may be performed by a third voltage source 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for applying, during a first duration, a first voltage to a word line coupled with a set of memory cells, where, during the first duration, at least one memory cell of a first subset of the set of memory cells thresholds based at least in part on applying the first voltage to the word line, applying, during a second duration after the first duration, a second voltage to the word line, where, during the second duration, at least one memory cell of a second subset of the set of memory cells thresholds and at least one memory cell of the first subset of the set of memory cells is written to a first logic state based at least in part on applying the second voltage to the word line, and applying, during a third duration after the second duration, a third voltage to the word line, where, during the third duration, at least one memory cell of the second subset of the set of memory cells is written to a second logic state based at least in part on applying the third voltage to the word line.

In some examples of the method 700 and the apparatus described herein, the second voltage may be applied to the word line for the entirety of the second duration.

Some examples of the method 700 and the apparatus described herein may further include operations, features, circuitry, logic, means, or instructions for applying, during a second portion of the second duration, the second voltage to the word line for a second time, where, during the second portion of the second duration, at least one additional memory cell of the second subset of the set of memory cells thresholds based at least in part on applying the second voltage to the word line for a second time.

Some examples of the method 700 and the apparatus described herein may further include operations, features, circuitry, logic, means, or instructions for applying, during the second duration after the first duration, a fourth voltage to a digit line associated with the at least one memory cell of the first subset of the set of memory cells based at least in part on applying the second voltage to the word line, where the at least one memory cell of the first subset of the set of memory cells may be written to the first logic state based at least in part on applying the fourth voltage to the digit line.

In some examples of the method 700 and the apparatus described herein, during the first duration, the at least one memory cell of a first subset of the set of memory cells thresholds based at least in part on a prior logic state written to the at least one memory cell of the first subset of the set of memory cells.

In some examples of the method 700 and the apparatus described herein, during the second duration, the at least one memory cell of a second subset of the set of memory cells thresholds before the at least one memory cell of the first subset of the set of memory cells may be written to a first logic state based at least in part on applying the second voltage to the word line.

In some examples of the method 700 and the apparatus described herein, the first voltage and the third voltage include a same voltage.

Figure 8:
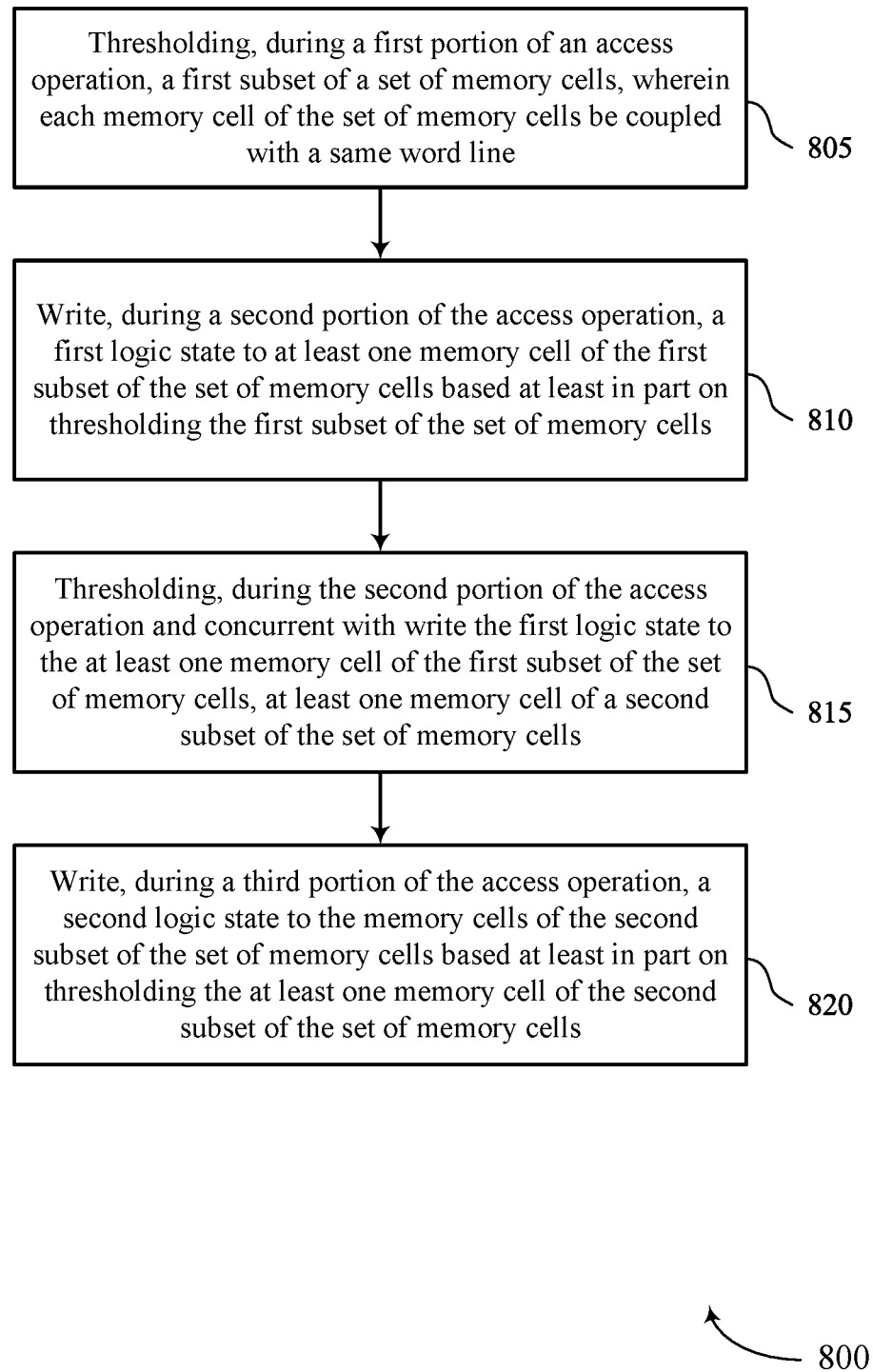

FIG. 8 shows a flowchart illustrating a method 800 that supports parallel drift cancellation in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 805, the method may include thresholding, during a first portion of an access operation, a first subset of a set of memory cells, where each memory cell of the set of memory cells is coupled with a same word line. The operations of 805 may be performed in accordance with examples as disclosed herein. In some examples, aspects of the operations of 805 may be performed by a thresholding component 640 as described with reference to FIG. 6.

At 810, the method may include writing, during a second portion of the access operation, a first logic state to at least one memory cell of the first subset of the set of memory cells based at least in part on thresholding the first subset of the set of memory cells. The operations of 810 may be performed in accordance with examples as disclosed herein. In some examples, aspects of the operations of 810 may be performed by an access component 645 as described with reference to FIG. 6.

At 815, the method may include thresholding, during the second portion of the access operation and concurrent with writing the first logic state to the at least one memory cell of the first subset of the set of memory cells, at least one memory cell of a second subset of the set of memory cells. The operations of 815 may be performed in accordance with examples as disclosed herein. In some examples, aspects of the operations of 815 may be performed by a thresholding component 640 as described with reference to FIG. 6.

At 820, the method may include writing, during a third portion of the access operation, a second logic state to the memory cells of the second subset of the set of memory cells based at least in part on thresholding the at least one memory cell of the second subset of the set of memory cells. The operations of 820 may be performed in accordance with examples as disclosed herein. In some examples, aspects of the operations of 820 may be performed by an access component 645 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for thresholding, during a first portion of an access operation, a first subset of a set of memory cells, where each memory cell of the set of memory cells is coupled with a same word line, writing, during a second portion of the access operation, a first logic state to at least one memory cell of the first subset of the set of memory cells based at least in part on thresholding the first subset of the set of memory cells, thresholding, during the second portion of the access operation and concurrent with writing the first logic state to the at least one memory cell of the first subset of the set of memory cells, at least one memory cell of a second subset of the set of memory cells, and writing, during a third portion of the access operation, a second logic state to the memory cells of the second subset of the set of memory cells based at least in part on thresholding the at least one memory cell of the second subset of the set of memory cells.

In some examples of the method 800 and the apparatus described herein, thresholding the first subset of the set of memory cells may include operations, features, circuitry, logic, means, or instructions for applying a first programming pulse to the set of memory cells during the first portion of the access operation, where the first programming pulse includes a first polarity.

In some examples of the method 800 and the apparatus described herein, the first subset of the set of memory cells thresholds based at least in part on applying the first programming pulse and based at least in part on a logic state written to the first subset of the set of memory cells during a prior access operation.

In some examples of the method 800 and the apparatus described herein, writing the first logic state to the at least one memory cell of the first subset of the set of memory cells and thresholding the at least one memory cell of the second subset of the set of memory cells may include operations, features, circuitry, logic, means, or instructions for applying a second programming pulse to the set of memory cells during the second portion of the access operation, where the second programming pulse includes a second polarity that may be different than the first polarity.

In some examples of the method 800 and the apparatus described herein, at least a portion of writing the first logic state to the at least one memory cell of the first subset of the set of memory cells and thresholding the at least one memory cell of the second subset of the set of memory cells occurs concurrently.

In some examples of the method 800 and the apparatus described herein, the at least one memory cell of the second subset of the set of memory cells may be thresholded before the first logic state may be written to the at least one memory cell of the first subset of the set of memory cells.

It should be noted that the methods described herein describe possible implementations, and that the operations and the steps may be rearranged or otherwise modified and that other implementations are possible. Furthermore, portions from two or more of the methods may be combined.

Another apparatus is described. The apparatus may include a set of memory cells, a word line coupled with the set of memory cells, a first voltage source coupled with the word line, a second voltage source coupled with the word line, a controller coupled with the first voltage source and the second voltage source, where the controller is operable to cause the apparatus to, apply, during a first duration, a first voltage to the word line coupled with the set of memory cells, where, during the first duration, at least one memory cell of a first subset of the set of memory cells thresholds based at least in part on applying the first voltage to the word line, apply, during a second duration after the first duration, a second voltage to the word line, where, during the second duration, at least one memory cell of a second subset of the set of memory cells thresholds and at least one memory cell of the first subset of the set of memory cells is written to a first logic state based at least in part on applying the second voltage to the word line, and apply, during a third duration after the second duration, a third voltage to the word line, where, during the third duration, at least one memory cell of the second subset of the set of memory cells is written to a second logic state based at least in part on applying the third voltage to the word line.

In some examples of the apparatus, the controller may be further operable to cause the apparatus to apply the second voltage to the word line for the entirety of the second duration.

In some examples, the apparatus may include apply, during a second portion of the second duration, the second voltage to the word line for a second time, where, during the second portion of the second duration, at least one additional memory cell of the second subset of the set of memory cells thresholds based at least in part on applying the second voltage to the word line for a second time.

In some examples, the apparatus may include apply, during the second duration after the first duration, a fourth voltage to a digit line associated with the at least one memory cell of the first subset of the set of memory cells based at least in part on applying the second voltage to the word line, where the at least one memory cell of the first subset of the set of memory cells may be written to the first logic state based at least in part on applying the fourth voltage to the digit line.

In some examples of the apparatus, during the first duration, the at least one memory cell of a first subset of the set of memory cells thresholds based at least in part on a prior logic state written to the at least one memory cell of the first subset of the set of memory cells.

In some examples of the apparatus, during the second duration, the at least one memory cell of a second subset of the set of memory cells thresholds before the at least one memory cell of the first subset of the set of memory cells may be written to a first logic state based at least in part on applying the second voltage to the word line.

In some examples of the apparatus, the first voltage and the third voltage include a same voltage.

Another apparatus is described. The apparatus may include a set of memory cells, a word line coupled with the set of memory cells, a controller coupled with the word line and operable to cause the apparatus to, threshold, during a first portion of an access operation, a first subset of the set of memory cells, where each memory cell of the set of memory cells is coupled with the word line, write, during a second portion of the access operation, a first logic state to at least one memory cell of the first subset of the set of memory cells based at least in part on thresholding the first subset of the set of memory cells, threshold, during the second portion of the access operation and concurrent with writing the first logic state to the at least one memory cell of the first subset of the set of memory cells, at least one memory cell of a second subset of the set of memory cells, and write, during a third portion of the access operation, a second logic state to the memory cells of the second subset of the set of memory cells based at least in part on thresholding the at least one memory cell of the second subset of the set of memory cells.

In some examples, the apparatus may include applying a first programming pulse to the set of memory cells during the first portion of the access operation, where the first programming pulse includes a first polarity.

In some examples of the apparatus, the first subset of the set of memory cells thresholds based at least in part on applying the first programming pulse and based at least in part on a logic state written to the first subset of the set of memory cells during a prior access operation.

In some examples, the apparatus may include applying a second programming pulse to the set of memory cells during the second portion of the access operation, where the second programming pulse includes a second polarity that may be different than the first polarity.

In some examples of the apparatus, at least a portion of writing the first logic state to the at least one memory cell of the first subset of the set of memory cells and thresholding the at least one memory cell of the second subset of the set of memory cells occurs concurrently.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    applying, during a first duration, a first voltage to a word line coupled with a set of memory cells, wherein, during the first duration, at least one memory cell of a first subset of the set of memory cells thresholds based at least in part on applying the first voltage to the word line;
    applying, during a second duration after the first duration, a second voltage to the word line, wherein, during the second duration, at least one memory cell of a second subset of the set of memory cells thresholds and at least one memory cell of the first subset of the set of memory cells is written to a first logic state based at least in part on applying the second voltage to the word line; and
    applying, during a third duration after the second duration, a third voltage to the word line, wherein, during the third duration, at least one memory cell of the second subset of the set of memory cells is written to a second logic state based at least in part on applying the third voltage to the word line.

2. The method of claim 1, wherein the second voltage is applied to the word line for the entirety of the second duration.

3. The method of claim 1, further comprising:
    applying, during a second portion of the second duration, the second voltage to the word line for a second time, wherein, during the second portion of the second duration, at least one additional memory cell of the second subset of the set of memory cells thresholds based at least in part on applying the second voltage to the word line for a second time.

4. The method of claim 1, further comprising:
applying, during the second duration after the first duration, a fourth voltage to a digit line associated with the at least one memory cell of the first subset of the set of memory cells based at least in part on applying the second voltage to the word line, wherein the at least one memory cell of the first subset of the set of memory cells is written to the first logic state based at least in part on applying the fourth voltage to the digit line.

5. The method of claim 1, wherein during the first duration, the at least one memory cell of a first subset of the set of memory cells thresholds based at least in part on a prior logic state written to the at least one memory cell of the first subset of the set of memory cells.

6. The method of claim 1, wherein during the second duration, the at least one memory cell of a second subset of the set of memory cells thresholds before the at least one memory cell of the first subset of the set of memory cells is written to a first logic state based at least in part on applying the second voltage to the word line.

7. The method of claim 1, wherein the first voltage and the third voltage comprise a same voltage.

8. A method, comprising:
thresholding, during a first portion of an access operation, a first subset of a set of memory cells, wherein each memory cell of the set of memory cells is coupled with a same word line;
writing, during a second portion of the access operation, a first logic state to at least one memory cell of the first subset of the set of memory cells based at least in part on thresholding the first subset of the set of memory cells;
thresholding, during the second portion of the access operation and concurrent with writing the first logic state to the at least one memory cell of the first subset of the set of memory cells, at least one memory cell of a second subset of the set of memory cells; and
writing, during a third portion of the access operation, a second logic state to the memory cells of the second subset of the set of memory cells based at least in part on thresholding the at least one memory cell of the second subset of the set of memory cells.

9. The method of claim 8, wherein thresholding the first subset of the set of memory cells comprises:
applying a first programming pulse to the set of memory cells during the first portion of the access operation, wherein the first programming pulse comprises a first polarity.

10. The method of claim 9, wherein the first subset of the set of memory cells thresholds based at least in part on applying the first programming pulse and based at least in part on a logic state written to the first subset of the set of memory cells during a prior access operation.

11. The method of claim 9, wherein writing the first logic state to the at least one memory cell of the first subset of the set of memory cells and thresholding the at least one memory cell of the second subset of the set of memory cells comprises:
applying a second programming pulse to the set of memory cells during the second portion of the access operation, wherein the second programming pulse comprises a second polarity that is different than the first polarity.

12. The method of claim 8, wherein at least a portion of writing the first logic state to the at least one memory cell of the first subset of the set of memory cells and thresholding the at least one memory cell of the second subset of the set of memory cells occurs concurrently.

13. The method of claim 8, wherein the at least one memory cell of the second subset of the set of memory cells is thresholded before the first logic state is written to the at least one memory cell of the first subset of the set of memory cells.

14. An apparatus, comprising:
a set of memory cells;
a word line coupled with the set of memory cells;
a first voltage source coupled with the word line;
a second voltage source coupled with the word line; and
a controller coupled with the first voltage source and the second voltage source, wherein the controller is operable to cause the apparatus to:
apply, during a first duration, a first voltage to the word line coupled with the set of memory cells, wherein, during the first duration, at least one memory cell of a first subset of the set of memory cells thresholds based at least in part on applying the first voltage to the word line;
apply, during a second duration after the first duration, a second voltage to the word line, wherein, during the second duration, at least one memory cell of a second subset of the set of memory cells thresholds and at least one memory cell of the first subset of the set of memory cells is written to a first logic state based at least in part on applying the second voltage to the word line; and
apply, during a third duration after the second duration, a third voltage to the word line, wherein, during the third duration, at least one memory cell of the second subset of the set of memory cells is written to a second logic state based at least in part on applying the third voltage to the word line.

15. The apparatus of claim 14, wherein the controller is further operable to cause the apparatus to apply the second voltage to the word line for the entirety of the second duration.

16. The apparatus of claim 14, wherein the controller is further operable to cause the apparatus to:
apply, during a second portion of the second duration, the second voltage to the word line for a second time, wherein, during the second portion of the second duration, at least one additional memory cell of the second subset of the set of memory cells thresholds based at least in part on applying the second voltage to the word line for a second time.

17. The apparatus of claim 14, wherein the controller is further operable to cause the apparatus to:
apply, during the second duration after the first duration, a fourth voltage to a digit line associated with the at least one memory cell of the first subset of the set of memory cells based at least in part on applying the second voltage to the word line, wherein the at least one memory cell of the first subset of the set of memory cells is written to the first logic state based at least in part on applying the fourth voltage to the digit line.

18. The apparatus of claim 14, wherein during the first duration, the at least one memory cell of a first subset of the set of memory cells thresholds based at least in part on a prior logic state written to the at least one memory cell of the first subset of the set of memory cells.

19. The apparatus of claim 14, wherein during the second duration, the at least one memory cell of a second subset of the set of memory cells thresholds before the at least one memory cell of the first subset of the set of memory cells is written to a first logic state based at least in part on applying the second voltage to the word line.

20. The apparatus of claim 14, wherein the first voltage and the third voltage comprise a same voltage.

21. An apparatus, comprising:
a set of memory cells;
a word line coupled with the set of memory cells; and
a controller coupled with the word line and operable to cause the apparatus to:
threshold, during a first portion of an access operation, a first subset of the set of memory cells, wherein each memory cell of the set of memory cells is coupled with the word line;
write, during a second portion of the access operation, a first logic state to at least one memory cell of the first subset of the set of memory cells based at least in part on thresholding the first subset of the set of memory cells;
threshold, during the second portion of the access operation and concurrent with writing the first logic state to the at least one memory cell of the first subset of the set of memory cells, at least one memory cell of a second subset of the set of memory cells; and
write, during a third portion of the access operation, a second logic state to the memory cells of the second subset of the set of memory cells based at least in part on thresholding the at least one memory cell of the second subset of the set of memory cells.

22. The apparatus of claim 21, wherein the controller is further operable to threshold the first subset of the set of memory cells by:
applying a first programming pulse to the set of memory cells during the first portion of the access operation, wherein the first programming pulse comprises a first polarity.

23. The apparatus of claim 22, wherein the first subset of the set of memory cells thresholds based at least in part on applying the first programming pulse and based at least in part on a logic state written to the first subset of the set of memory cells during a prior access operation.

24. The apparatus of claim 22, the controller is further operable to write the first logic state to the at least one memory cell of the first subset of the set of memory cells and threshold the at least one memory cell of the second subset of the set of memory cells by:
applying a second programming pulse to the set of memory cells during the second portion of the access operation, wherein the second programming pulse comprises a second polarity that is different than the first polarity.

25. The apparatus of claim 21, wherein at least a portion of writing the first logic state to the at least one memory cell of the first subset of the set of memory cells and thresholding the at least one memory cell of the second subset of the set of memory cells occurs concurrently.

* * * * *